United States Patent
Kwak et al.

(10) Patent No.: US 6,794,247 B2
(45) Date of Patent: Sep. 21, 2004

(54) METHOD OF FABRICATING A SEMICONDUCTOR MEMORY DEVICE HAVING RESISTOR

(75) Inventors: Dong-Hwa Kwak, Kyungki-do (KR); Byung-Seo Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/272,670

(22) Filed: Oct. 16, 2002

(65) Prior Publication Data

US 2003/0127705 A1 Jul. 10, 2003

(30) Foreign Application Priority Data

Jan. 7, 2002 (KR) .............................................. 2002-744

(51) Int. Cl.[7] .............................................. H01L 21/336
(52) U.S. Cl. ...................................... 438/257; 438/259
(58) Field of Search ............................... 438/257–259, 438/637–639, 672–673

(56) References Cited

U.S. PATENT DOCUMENTS 6,548,851 B2 * 4/2003 Bae ............................ 257/306

FOREIGN PATENT DOCUMENTS

JP 2000-294749 10/2000
KR 2001-0114003 12/2001

OTHER PUBLICATIONS

English language of Abstract for Korean Patent Publication No. 2001-0114003.
English language of Abstract for Japanese Patent Publication No. 2000-294749.

* cited by examiner

Primary Examiner—Dung A. Le
(74) Attorney, Agent, or Firm—Marger Johnson & McCollom, P.C.

(57) ABSTRACT

A method of fabricating a semiconductor device having a cell array area and a peripheral circuit area is provided. A mold layer is formed on a substrate in the cell array area and the peripheral circuit area. A plurality of first molding holes are formed in the mold layer in the cell array area. A second molding hole is formed in the mold layer in the peripheral circuit area. A storage node layer is formed on the mold layer, in the first molding holes and in the second molding hole. A plurality of storage nodes are formed in the first molding holes and a first portion of a resistor is formed in the second molding hole by removing a portion of the storage node layer. The first portion of the resistor is formed of the storage node layer.

17 Claims, 8 Drawing Sheets

METHOD OF FABRICATING A SEMICONDUCTOR MEMORY DEVICE HAVING RESISTOR

This application relies for priority upon Korean Patent Application No. 2002-744, filed on Jan. 7, 2002, the contents of which are herein incorporated by reference in their entirety.

FIELD OF THE INVENTION

The present invention relates to a semiconductor device and method of fabricating the same, and more specifically to a dynamic random access memory (DRAM) device having a resistor and method of fabricating the same.

BACKGROUND OF THE INVENTION

Generally, a DRAM device comprises a cell array area and a peripheral circuit area. The cell array area includes a plurality of unit cells, each of which comprises a MOS transistor and a storage capacitor. The storage capacitor comprises a lower electrode (i.e., storage node) and an upper electrode (i.e., plate node). It is a generally accepted fact in industry that the capacitance of the storage capacitor is required to be 0.25 $\mu$F or more, while the unit cell size has been constantly reduced for higher packing density of a DRAM device. One of approaches used to retain the required value of the capacitance is to increase the height of the storage capacitor. Especially in the case of a DRAM device with single cylinder type storage nodes and a design rule of 0.15 $\mu$m, the height of the storage node is required to be about 1.4 $\mu$m or more. The increased height of the storage node induces an increased step difference between the cell array area and the peripheral circuit area in the DRAM device.

Meanwhile, resistors are widely used in semiconductor memory devices including DRAM devices. The resistors are usually formed in the peripheral circuit area of a semiconductor memory device. One example of an application of the resistors is a circuit for converting an external voltage level into an internal voltage level. In DRAM devices, the resistors are usually formed of the same material as the plate node and are formed at the same process step for forming the plate node. In detail, a plate node layer is formed on storage nodes and a peripheral circuit area. The plate node layer is patterned to form a plate node on the storage nodes and resistors on the peripheral circuit area simultaneously.

However, in recent DRAM devices having high packing density, the patterns of the resistors are not fine. That is, it is very difficult to maintain uniformity in the widths of the resistors. The irregular widths induce irregular resistance of the resistors. As a result, abnormal operations of the DRAM devices may occur. The width irregularity problem is mainly due to the above-mentioned step difference between the cell array area and the peripheral circuit area.

The irregularity problem may be relieved by using a well-known advanced photolithography process that is able to pattern the plate node layer into quite fine patterns of resistors in spite of the increased step difference. However, the cost of the advanced process is too expensive such that it cannot be widely accepted in industry. Accordingly, the need to relieve the width irregularity problem without substantially increasing the cost for patterning the plate node layer remains.

SUMMARY OF THE INVENTION

It is an object of the present invention to provide a method for forming a semiconductor device, wherein resistors on the peripheral circuit area have substantially uniform widths without substantially increasing the cost for patterning the plate node layer.

It is another object of the present invention to provide a method for forming a DRAM device, wherein resistors on the peripheral circuit area have substantially uniform resistance values without substantially increasing the cost for patterning the plate node layer.

It is another object of the present invention to provide a semiconductor device, wherein resistors on the peripheral circuit area have substantially uniform widths and resistance values so as to substantially avoid abnormal operations of the semiconductor device.

According to one aspect of the present invention, a method of fabricating a semiconductor device is provided. The method comprises forming a mold layer on a substrate. The mold layer is patterned to form a plurality of first molding holes, a second molding hole and a third molding hole in the mold layer. A storage node layer is formed on the mold layer as well as in the first, second and third molding holes. A portion of the storage node layer is removed to form a plurality of storage nodes, a first portion of a resistor and a first portion of a conductive stud in the first, second and third molding holes respectively. The first portion of the resistor and the first portion of the stud are formed of the storage node layer material. Each of the storage nodes has an inner wall and an outside wall. A portion of the mold layer is removed, thereby exposing a portion of the outside wall and leaving a remaining portion of the mold layer in the peripheral circuit area. The portion of the mold layer is interposed between each of the storage nodes. The remaining portion of the mold layer has the second molding hole therethrough. A capacitor dielectric layer is formed on the storage nodes and the remaining portion of the mold layer. A plate node layer is formed on the capacitor dielectric layer. The plate node layer is patterned to form a plate node on the plurality of storage nodes. The plate node layer may be formed in the second or third molding holes to fill the second or third molding hole. The capacitor dielectric layer may also be formed in the second or third molding holes.

According to another aspect of the present invention, a method of fabricating a semiconductor device is provided. The method comprises providing a substrate and defining a first area and a second area in the substrate. A mold layer is formed on the substrate and in the first and second areas. An anti-reflective layer is formed on the mold layer. A first portion of the anti-reflective layer is selectively etched, thereby reducing the thickness of the anti-reflective layer in the first area. The first portion of the anti-reflective layer is located in the first area. First molding holes and a second molding hole are formed in the first area and second area respectively by patterning the mold layer and the anti-reflective layer. A second portion of the anti-reflective layer is etched to leave a remaining portion of the anti-reflective layer only in the second area. A storage node layer is formed on the mold layer as well as in the first and second molding holes. A plurality of storage nodes and a first portion of a resistor are formed in the first molding holes and in the second molding hole respectively by removing a portion of the storage node layer. The first portion of a resistor is formed of the storage node layer. Each of the storage nodes has an inner wall and an outside wall. A portion of the mold layer is etched by using the remaining portion of the anti-reflective layer as a etch mask, thereby exposing a portion of the outside wall and leaving a remaining portion of the mold layer in the second area. A portion of the mold layer is located in the first area. The remaining portion of the mold layer has the second molding hole therethrough.

According to another aspect of the present invention, a semiconductor device is provided. The semiconductor device comprises a plurality of storage nodes on a substrate. A mold layer is formed on the substrate. The mold layer surrounds the plurality of storage nodes in plan view. A resistor is formed through the mold layer. The resistor comprises a material of the storage nodes. The height of the plurality of storage nodes is substantially same as the thickness of the mold layer. The height of the resistor is substantially same as the thickness of the mold layer. A plate node is formed on the plurality of storage nodes. A capacitor dielectric layer is formed between the plurality of storage nodes and the plate node. The resistor may further comprise a material of the plate node or a material of the capacitor dielectric layer.

A conductive stud is formed through the mold layer. The stud comprises a material of the storage nodes. The height of the plurality of storage nodes is substantially same as the height of the stud.

According to another aspect of the present invention, a semiconductor device is provided. The semiconductor device comprises a mold layer on the substrate. The mold layer comprises a recess region. A resistor is formed in the recess region.

BRIEF DESCRIPTION OF THE DRAWINGS

Other features of the present invention will be more readily understood from the following detail description of specific embodiment thereof when read in conjunction with the accompanying drawings, in which.

DESCRIPTION OF THE PREFERRED EMBODIMENT

Preferred embodiments of the present invention will be described hereinafter with reference to the accompanying drawings, even though the scope of the present invention is not limited to the embodiments. In drawings, the geometrical magnitude of elements may be exaggerated for clarity. Like reference numerals in the drawings denote the same members.

Figure 1:
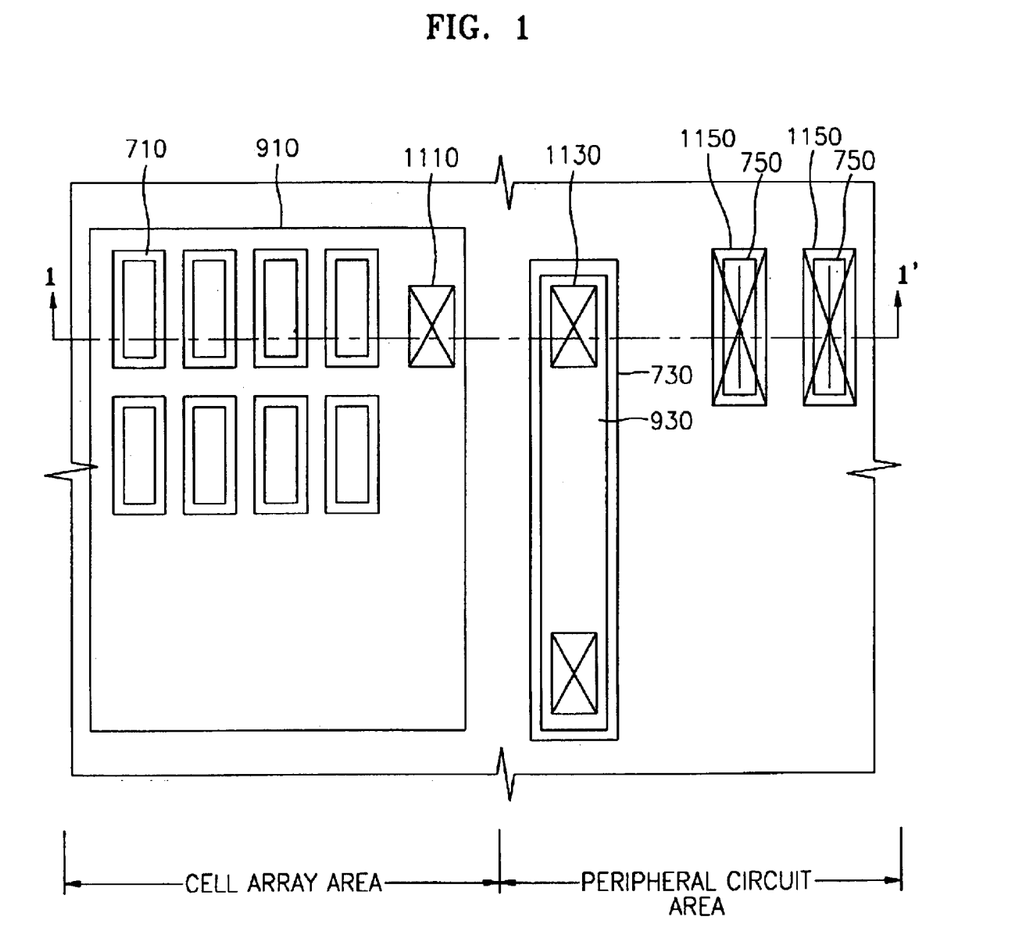
FIG. 1 is a schematic plan view illustrating the layout of storage nodes and a resistor in a DRAM device according to a preferred embodiment of the present invention.

FIG. 1 is a schematic plan view illustrating the layout of storage nodes and a resistor in a DRAM device according to a preferred embodiment of the present invention. FIGS. 2 through 12 are cross-sectional views taken along a line 1-1' of FIG. 1. The cross-sectional views are for illustrating successive process steps for forming the DRAM device according to a preferred embodiment of the present invention.

Figure 2:
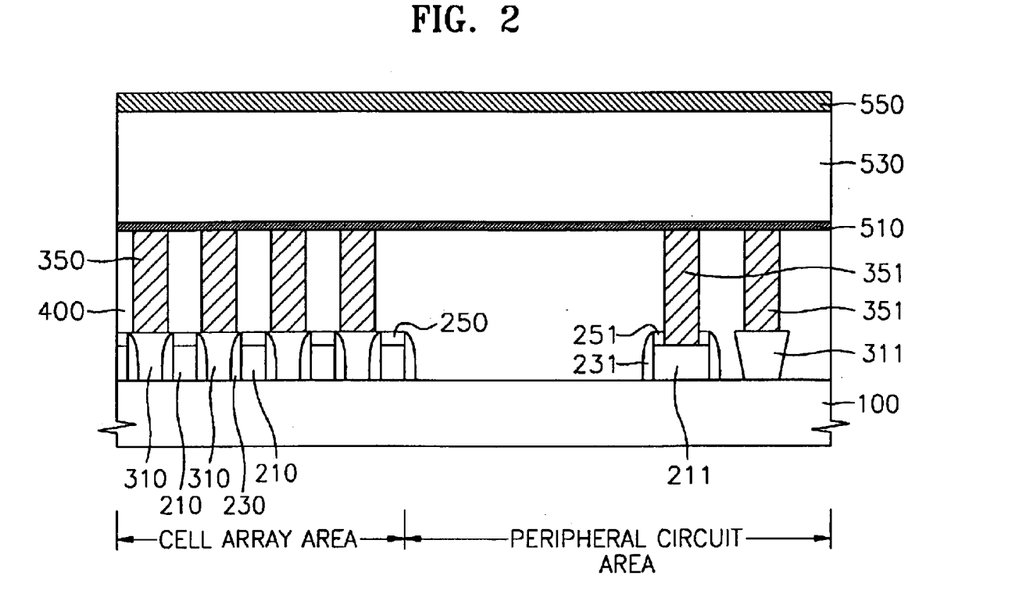
FIGS. 2 through 12 are cross-sectional views illustrating successive process steps for forming the DRAM device of FIG. 1.

Referring to FIG. 2, a plurality of cell gate patterns 210 and a peripheral gate pattern 211 are formed on a semiconductor substrate 100. The cell gate patterns 210 and the peripheral gate pattern 211 are formed in a cell array area and a peripheral circuit area respectively. Cell capping insulating layers 250 and cell spacers 230 are formed on the top surfaces and the sidewalls of the cell gate patterns 210, respectively. A peripheral capping insulating layer 251 and a peripheral spacer 231 are formed on the top surfaces and the sidewalls of the peripheral gate pattern 211, respectively.

Between the cell gate patterns 210, cell contact pads 310 are formed to contact the substrate 100. A peripheral contact pad 311 is formed on the substrate 100 in the peripheral circuit area. It is well know in the industry that interlayer interconnections can be formed easily by using the contact pads. On the resultant structure, a lower interlayer insulating film 400 is formed. On the cell contact pads 310, conductive storage studs 350 are formed through the lower interlayer insulating film 400. Though not shown in the drawings, the conductive storage studs 350 are formed between bit lines in plan view. On the peripheral contact pad 311 and the peripheral gate pattern 211, conductive lower peripheral studs 351 are formed down through the lower interlayer insulating film 400.

On the resultant structure, an etching-stopping layer 510 and a mold layer 530 are formed sequentially. The thickness of the mold layer 530 is determined by the intended height of the storage nodes, which are to be formed in subsequent process steps. For example, if the intended height of the storage nodes is 1.4 $\mu$m, the thickness of the mold layer 530 is preferably 1.4 $\mu$m or more. The mold layer 530 is preferably formed of an insulating material including silicon oxide. The etching-stopping layer 510 is preferably formed of an insulating material having etching selectivity to the material of the mold layer 530. The etching-stopping layer 510 is preferably formed of silicon nitride. The upper surface of the mold layer 530 may be planarized by a well-known technique. On the mold layer 530, an anti-reflective layer 550 is formed. The anti-reflective layer 550 is preferably formed of an inorganic material.

Figure 3:
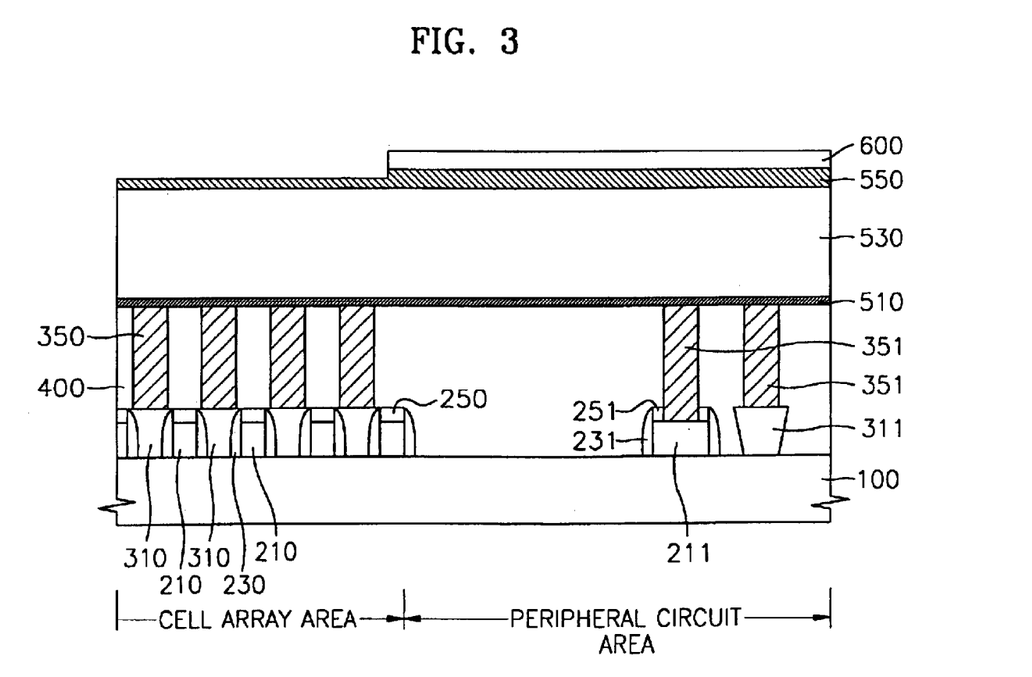

Referring to FIG. 3, a photoresist pattern 600 is formed on the anti-reflective layer 550. The photoresist pattern 600 is formed only in the peripheral circuit area. A first portion of the anti-reflective layer 550, which is located in the first area, is selectively etched by using the photoresist pattern 600 as a etch mask, thereby reducing the thickness of the anti-reflective layer 550 in the cell array area. Subsequently, the photoresist pattern 600 is removed.

Figure 4:
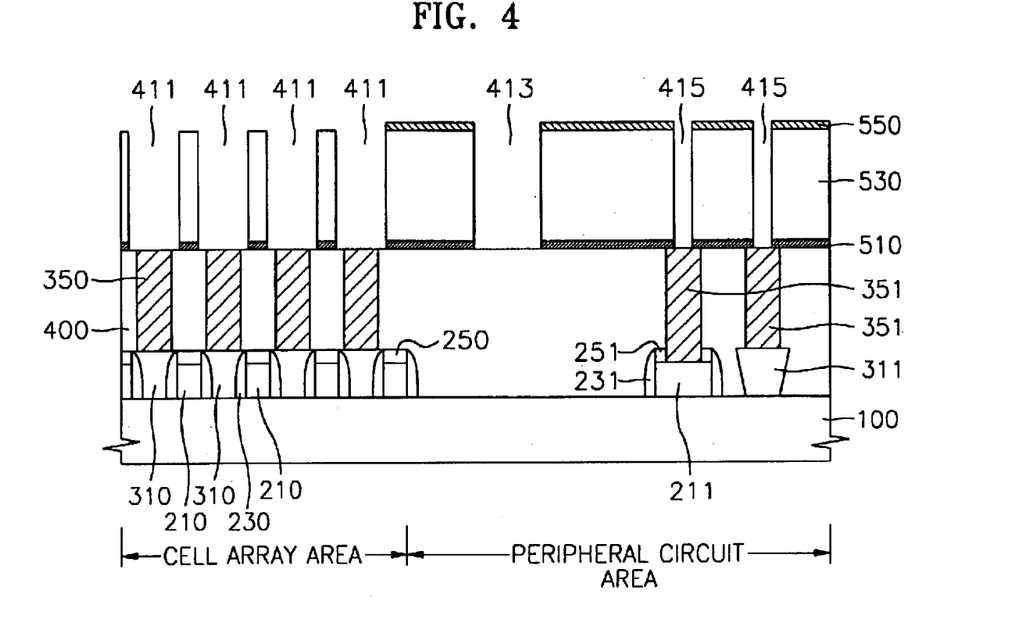

Referring to FIG. 4, the mold layer 530 and the anti-reflective layer 550 are patterned to form recess regions in the mold layer 530. The recess regions are a plurality of first molding holes 411, a second molding hole 413 and third molding holes 415, which are formed simultaneously. The first molding holes 411 are formed in the cell array area. The second molding hole 413 and the third molding holes 415 are formed in the peripheral circuit area. The patterning of the mold layer 530 and the anti-reflective layer 550 is performed by a photolithography process. In detail, a photoresist pattern (not shown in the drawings) is formed on the anti-reflective layer 550. The mold layer 530 and the anti-reflective layer 550 are selectively etched by using the photoresist pattern as a etch mask. One skilled in the art would recognize that the anti-reflective layer 550 substantially prevents undesirable scattered reflection during the photolithography process. The selective etching is performed to the extent that the etching-stopping layer 510 is exposed by the first, second and third molding holes 411, 413, 415. In other words, the ending of the selective etching is adjusted by detecting the exposing of the etching-stopping layer 510. Subsequently, the photoresist pattern is removed.

The first molding holes 411 are used for forming the storage nodes in subsequent process step and determine the fineness of patterns of the storage nodes. The photolithography process for the patterning the first molding holes 411 is usually an advanced process that is able to form very fine patterns. Even though the cost of the advanced process is expensive, it is widely accepted in industry because of the importance of forming fine patterns of storage nodes in DRAM devices. All of the first, second and third molding holes are formed simultaneously by the advanced process. Therefore, the second molding hole 413 and the third molding holes 415 as well as the first molding holes 411 can also be formed finely. For example, the width of the second molding hole 413 can be as small as approximately 100 nm~1500 nm.

The exposed portion of the etching-stopping layer 510 is etched so that the storage studs 350 and the lower peripheral studs 351 are exposed by the first molding holes 411 and the third molding holes 415, respectively. During the etching of the exposed portion of the etching-stopping layer 510, a second portion of the anti-reflective layer 550 is also removed simultaneously. In detail, the anti-reflective layer 550 is entirely removed in the cell array area. Meanwhile, the anti-reflective layer 550 in the peripheral circuit area is not entirely removed, but the thickness thereof is reduced, thereby leaving a remaining portion of the anti-reflective layer 550. The remaining portion of the anti-reflective layer 550 is selectively located only in the peripheral circuit area. This results from the thickness difference of the anti-reflective layer 550 between the peripheral circuit area and the cell array area just after the etching of the first portion of the anti-reflective layer 550 as described in FIG. 3. In other words, the anti-reflective layer 550 in the peripheral area is thicker that that of the cell array area described in FIG. 3. Therefore, an etching condition (including etching time) can be adjusted for the anti-reflective layer 550 in the peripheral circuit area not to be entirely removed, even though the anti-reflective layer 550 in the cell array area is entirely removed.

Figure 5:
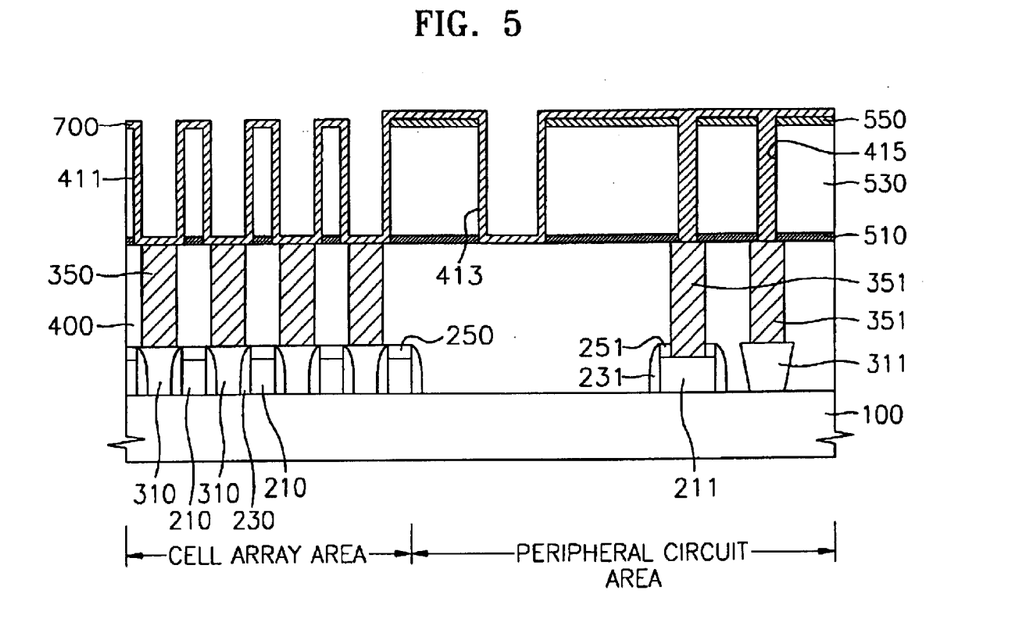

Referring to FIG. 5, a storage node layer 700 is formed on the mold layer 530 as well as in the first, second and third molding holes 411, 413, 415. The storage node layer 700 is formed of a conductive material e.g., polysilicon or metal. The storage node layer 700 does not completely fill the first molding holes 411, but is conformably formed on the bottoms and sidewalls of the first molding holes 411 and the second molding hole 413. Meanwhile, the widths of the third molding holes 415 are narrow enough so that the storage node layer 700 completely fills the third molding holes 415 as shown in the drawings.

Figure 6:
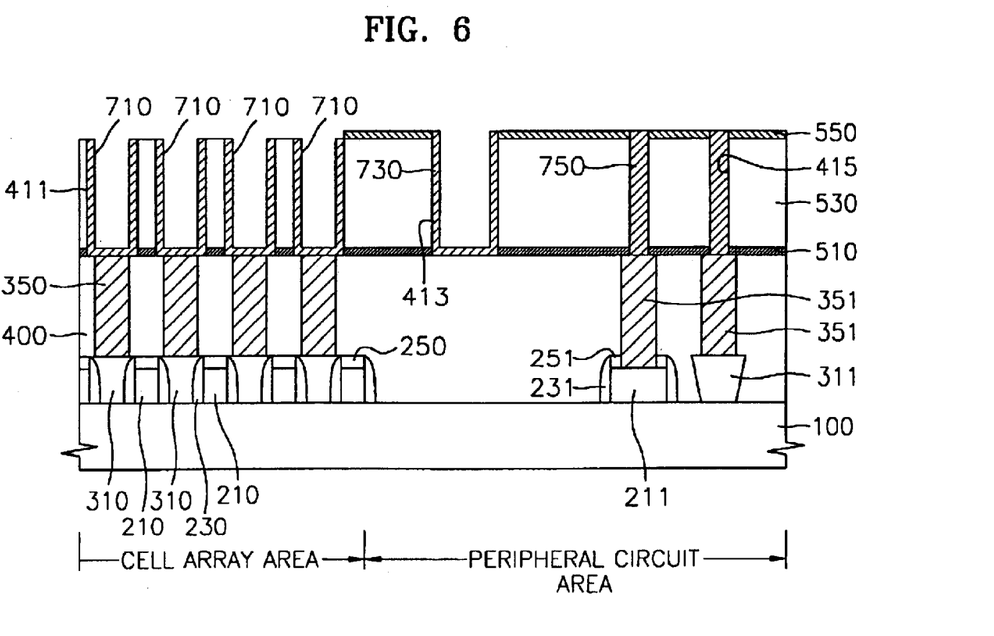

Referring to FIGS. 1 and 6, a portion of the storage node layer 700 is removed to form a plurality of storage nodes 710 in the first molding holes 411, a first portion 730 of a resistor in the second molding hole 413 and a first portion 750 of a conductive upper peripheral stud in the third molding hole 415. That is to say, an upper surface portion of the storage node layer 700, which is formed on the mold layer 530 and the anti-reflective layer 550, is selectively removed, preferably by an etch-back technique. As a result, the mold layer 530 is exposed in the cell array area, while the mold layer 530 is still covered by the anti-reflective layer 550, but not by the storage node layer 700, in the peripheral circuit area. The first portion 730 of the resistor and the first portion 750 of the upper peripheral stud are formed from the storage node layer 700. Consequently, the upper peripheral stud is completed. The upper peripheral stud is formed only of the storage node layer 700. Each of the storage nodes 710 has an inner wall and an outside wall. As described in FIG. 1, the first portion 730 of the resistor has preferably a rectangular shape in plan view. The planar shape of the first portion 730 of the resistor is determined by the planar shape of the second molding hole 413.

Figure 7:
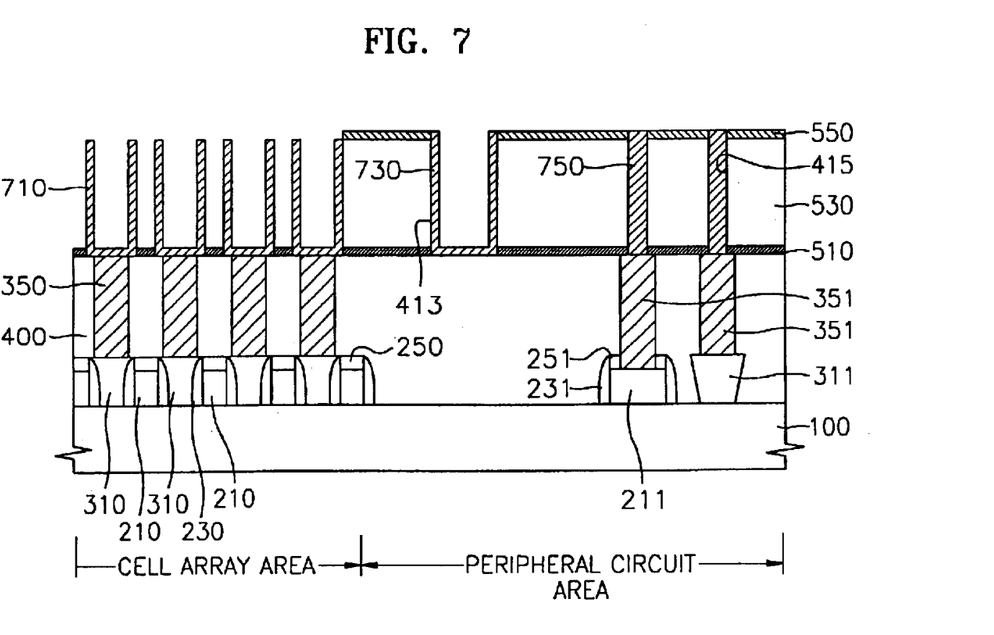

Referring to FIG. 7, a portion of the mold layer 530, which is interposed between each of the storage nodes 710 and located in the cell array area, is removed. That is to say, the portion of the mold layer 530 is selectively etched by using the remaining portion of the anti-reflective layer 550, the storage nodes 710, the first portion 730 of the resistor and the first portion 750 of the upper peripheral stud as etch masks, thereby exposing a portion of the outside wall and leaving a remaining portion of the mold layer 530. The removal of the portion of the mold layer 530 is preferably performed by a wet etching (i.e., a lift-off technique). The remaining portion of the mold layer 530 has the second molding hole 413 therethrough and surrounds the storage nodes 710. In the present invention, there is substantially no step difference between the cell array area and peripheral circuit area due to the remaining portion of the mold layer 530, even if the height of the storage nodes 710 is increased.

Figure 8:
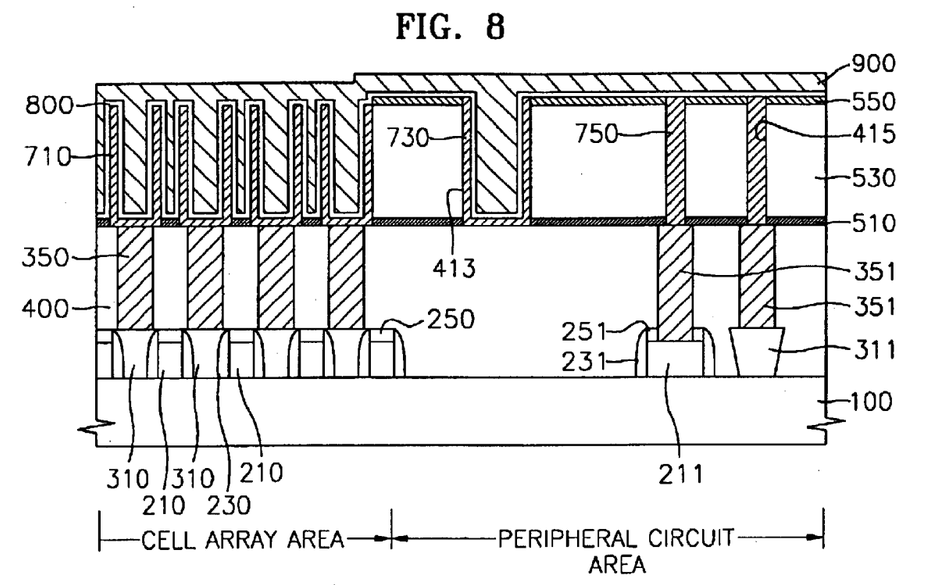

Referring to FIG. 8, a capacitor dielectric layer 800 is formed on the storage nodes 710, the first portion 730 of the resistor, the first portion 750 of the upper peripheral stud and the remaining portion of the mold layer 530. A plate node layer 900 is formed on the capacitor dielectric layer 800. The plate node layer 900 is formed of a conductive material e.g., polysilicon or metal. The plate node layer 900 preferably completely fills the first molding holes 411 and the second molding holes 413, and is extended on the first portion 750 of the upper peripheral stud.

In a first modified embodiment of the present invention, the width of the second molding hole 413 is so narrow enough that the storage node layer 700 completely fills the second molding hole 413. In this case, the capacitor dielectric layer 800 and the plate node layer 900 are not formed in the second molding hole 413, but formed on the first portion 730 of the resistor.

In a second modified embodiment of the present invention, the widths of the third molding holes 415 are wide enough that the storage node layer 700 does not completely fill the third molding holes 415, but is conformably formed on the bottoms and sidewalls as with the first molding holes 411. In this case, the capacitor dielectric layer 800 and/or the plate node layer 900 may be formed in the third molding holes 415.

Figure 9:
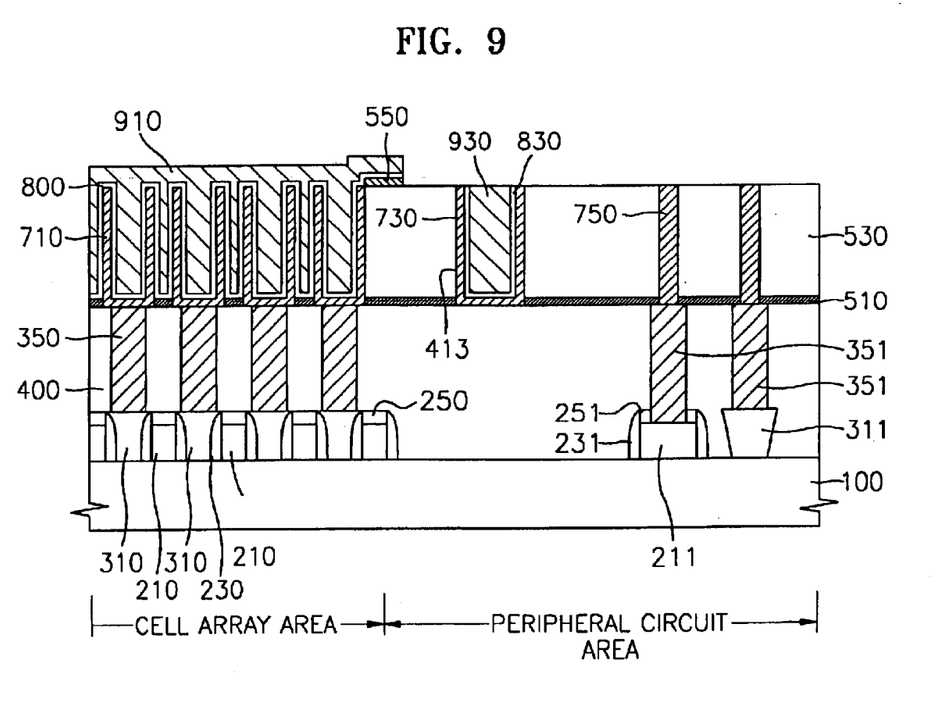

Referring to FIGS. 1 and 9, the plate node layer 900 and the capacitor dielectric layer 800 are patterned by a photolithography technique to form a plate node 910 on the plurality of storage nodes 710 in the cell array area. Moreover, the plate node layer 900, the capacitor dielectric layer 800 and the anti-reflective layer 550 are removed simultaneously in a portion of the peripheral circuit area except in the second molding hole 413. As a result, the remaining portion of the mold layer 530 is exposed and a second portion 830 of the resistor in the second molding hole 413 and a third portion 930 of the resistor in the second molding hole 413 are formed in the peripheral circuit area. The second portion 830 of the resistor is formed of the capacitor dielectric layer 800, and the third portion 930 of the resistor is formed of the plate node layer 900. Consequently, the resistor is completed and comprises the first portion 730, the second portion 830 and the third portion 930 thereof.

In the first modified embodiment of the present invention, the second portion 830 and the third portion 930 of the resistor are not formed. Consequently, the resistor is formed only of the storage node layer 700.

In the second modified embodiment of the present invention, a second portion and/or a third portion (not shown) of the upper peripheral studs are formed in the third molding hole 415 in the peripheral circuit area by similar method used to form the second portion 830 and third portion 930 of the resistor. The second portion of the upper peripheral studs is formed of the capacitor dielectric layer 800. The third portion of the upper peripheral stud is formed of the plate node layer 900.

Figure 10:
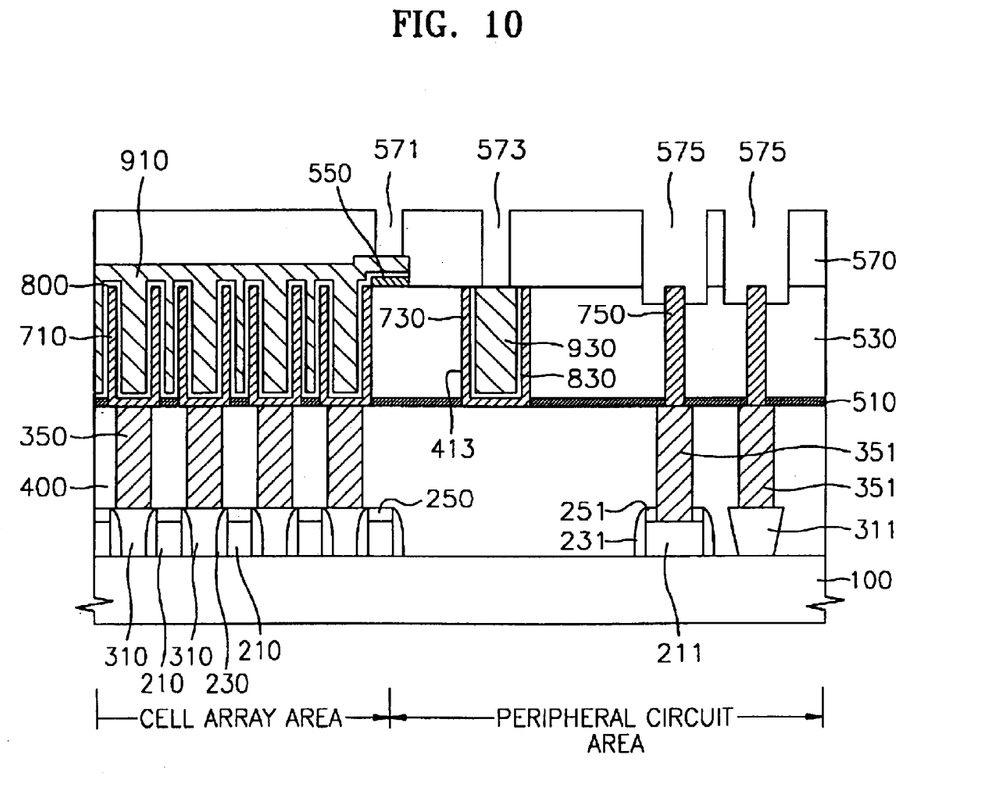

Referring to FIG. 10, an interlayer insulating layer 570 is formed on the resultant structure. The interlayer insulating layer 570 is patterned by using a photolithography technique, thereby forming a first contact hole 571, second contact holes 573 and third contact holes 575. The first contact hole 571 exposes a portion of the plate node 910. The second contact holes 573 expose the resistor. The third contact holes 575 expose the upper peripheral studs.

Figure 11:
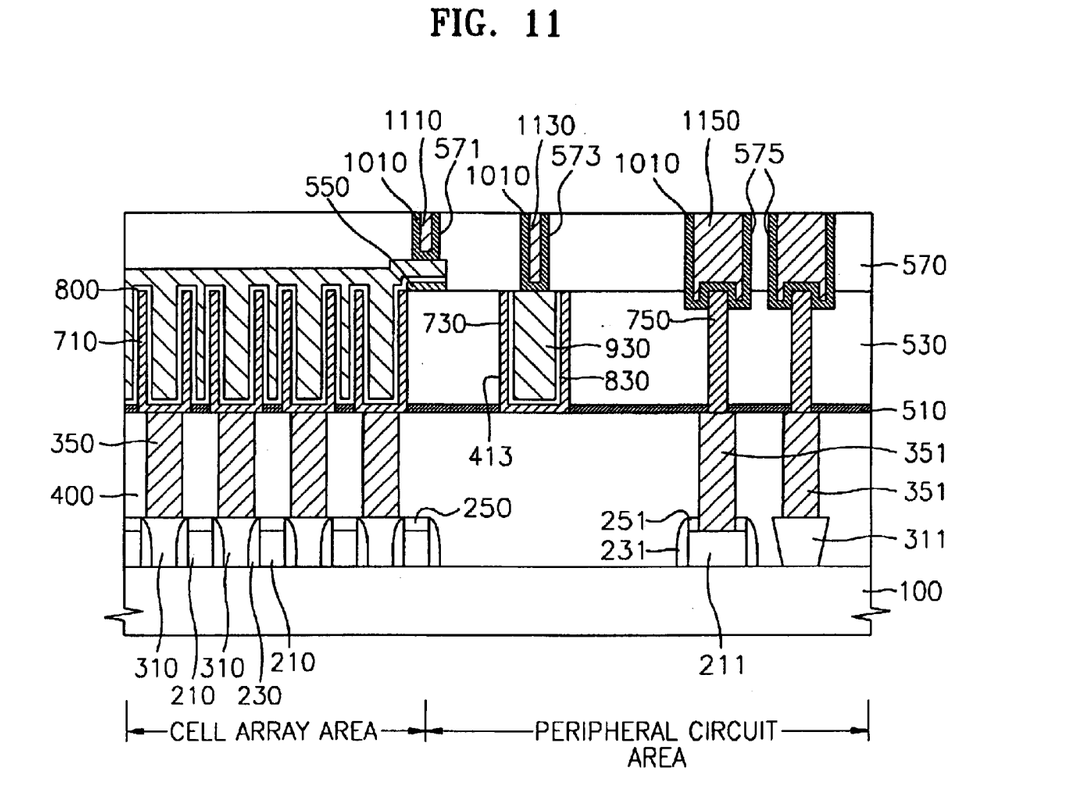

Referring to FIGS. 1 and 11, a first barrier metal layer 1010 is formed on the resultant structure. A plug metal layer (e.g., tungsten layer) is formed on the barrier metal layer 1010 and fills the first, second and third contact holes 571, 573, 575. Subsequently the plug metal layer is subjected to an etch-back technique or a planarization, thereby forming a first metal plug 1110, second metal plugs 1130 and third metal plugs 1150 in the first contact hole 571, the second contact hole 573 and the third contact hole 575, respectively.

Figure 12:
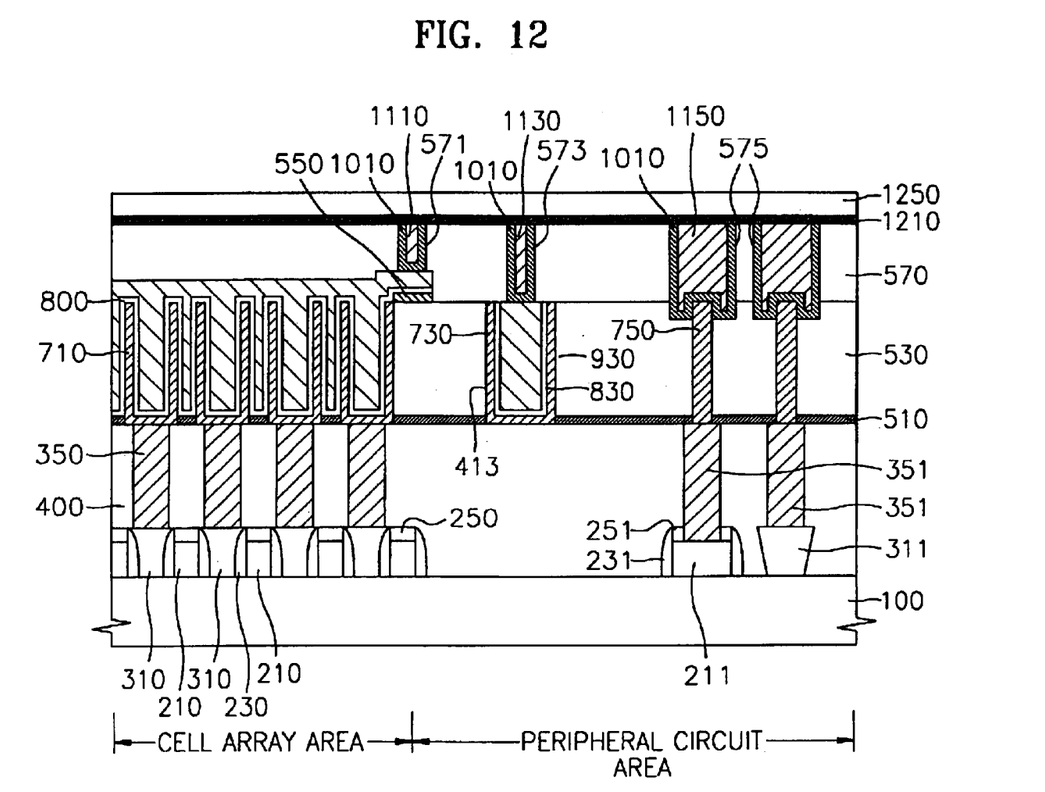

Referring to FIG. 12, a second barrier metal layer 1210 is formed on the resultant structure. A metal interconnection layer 1250 (e.g., aluminum layer) is formed on the second barrier metal layer 1210.

According to the DRAM device of the present invention formed as described above, the resistor is formed through the mold layer 530. The resistor comprises a material of the storage nodes 710. The height of the plurality of storage nodes 710 is substantially same as the thickness of the mold layer 530. The height of the resistor is substantially same as the thickness of the mold layer. The resistor may further comprise a material of the plate node 910 and a material of the capacitor dielectric layer 800. Conductive upper peripheral studs are formed through the mold layer 530. The upper peripheral stud comprises a material of the storage nodes 710. The height of the plurality of storage nodes 710 is substantially same as the height of the upper peripheral studs.

According to the present invention, the width of the resistor is determined by the patterning process used for the storage nodes 710, which is performed by an advanced photolithography process that is able to form very fine patterns. Therefore, the width of the resistor can be formed so finely as to substantially avoid the irregular width problem. Moreover, the remaining portion of the mold layer 530 compensates the possible step difference between the cell array area and the peripheral area. Therefore, there is no need of an additional process to relive the step difference. Meanwhile, the patterning of the plate node layer can be performed by a non-advanced photolithography process, which is not expensive, even though the packing density of the device is high. This is because the patterning of the plate node layer is not related to the steps of forming the resistor in the present invention. Therefore, resistors on the peripheral circuit area can be formed that have substantially uniform widths without increasing the cost for patterning the plate node layer and for substantially avoiding abnormal operations of the semiconductor device.

In the drawings and specification, there have been disclosed typical preferred embodiments of the invention. Although specific terms are employed, they are used in a generic and descriptive sense only and not for purpose of limitation. It will be understood by those skilled in the art that various changes in the embodiments may be made without departing from the spirit and scope of the invention.

What is claimed is:

1. A method of fabricating a semiconductor device having a cell array area and a peripheral circuit area, comprising:
   forming a mold layer on a substrate in the cell array area and the peripheral circuit area;
   forming a plurality of first molding holes in the mold layer in the cell array area;
   forming a second molding hole in the mold layer in the peripheral circuit area;
   forming a storage node layer on the mold layer, in the first molding holes and in the second molding hole; and
   forming a plurality of storage nodes in the first molding holes and a first portion of a resistor in the second molding hole by removing a portion of the storage node layer, wherein the first portion of the resistor is formed of the storage node layer.

2. The method of claim 1, wherein the storage node layer comprises a conductive polysilicon.

3. The method of claim 1, wherein the storage node layer comprises a metal.

4. The method of claim 1, which further comprises:
   forming a third molding hole in the mold layer in the peripheral circuit area; and
   forming a first portion of a conductive stud in the third molding hole by the removal of the portion of the storage node layer, wherein the first portion of the conductive stud is formed of the storage node layer.

5. The method of claim 1, wherein the removal of the portion of the storage node layer is performed by using an etch-back technique.

6. The method of claim 1, wherein each of the storage nodes has an inner wall and an outside wall.

7. The method of claim 6, which further comprises removing a portion of the mold layer interposed between each of the storage nodes, thereby exposing a portion of the outside walls of the storage nodes and leaving a remaining portion of the mold layer, wherein the remaining portion of the mold layer has the second molding hole therethrough.

8. The method of claim 7, which further comprises:
   forming a capacitor dielectric layer on the storage nodes; and
   forming a plate node layer on the capacitor dielectric layer.

9. The method of claim 8, wherein the plate node layer is formed also in the second molding hole, thereby filling the second molding hole, which further comprises forming a third portion of the resistor in the second molding hole, wherein the third portion of the resistor is formed of the plate node layer.

10. The method of claim 8, wherein the capacitor dielectric layer is formed also in the second molding hole, which further comprises forming a second portion of the resistor in the second molding hole, wherein the second portion of the resistor is formed of the capacitor dielectric layer.

11. The method of claim 8, which further comprises:
    forming a third molding hole in the mold layer in the peripheral circuit area; and
    forming a first portion of a conductive stud in the third molding hole by the removal of the portion of the storage node layer, wherein the first portion of the conductive stud is formed of the storage node layer.

12. The method of claim 11, wherein the plate node layer is formed also in the third molding hole, thereby filling the third molding hole, which further comprises forming a third portion of the conductive stud in the third molding hole, wherein the third portion of the conductive stud is formed of the plate node layer.

13. The method of claim 11, wherein the capacitor dielectric layer is formed also in the third molding hole, which further comprises forming a second portion of the conductive stud in the third molding hole, wherein the second portion of the conductive stud is formed of the capacitor dielectric layer.

14. A method of fabricating a semiconductor device, comprising:

provid ing a substrate;

defining a first area and a second area in the substrate;

forming a mold layer on the substrate;

forming an anti-reflective layer on the mold layer in the first and second areas;

selectively etching a first portion of the anti-reflective layer, which is located in the first area, thereby reducing the thickness of the anti-reflective layer in the first area;

forming a plurality of first molding holes in the first area by patterning the mold layer and the anti-reflective layer;

forming a second molding hole in the second area by patterning the mold layer and the anti-reflective layer;

etching a second portion of the anti-reflective layer, thereby completely removing the anti-reflective layer in the first area and leaving a remaining portion of the anti-reflective layer in the second area;

forming a storage node layer on the mold layer, in the first molding holes and in the second molding hole;

forming a plurality of storage nodes in the first molding holes and a first portion of a resistor in the second molding hole by removing a portion of the storage node layer, wherein the first portion of a resistor is formed of the storage node layer, wherein each of the storage nodes has an inner wall and an outside wall; and etching a portion of the mold layer, which is located in the first area, by using the remaining portion of the anti-reflective layer as a etch mask, thereby exposing a portion of the outside walls and leaving a remaining portion of the mold layer in the second area, wherein the remaining portion of the mold layer has the second molding hole therethrough.

15. The method of claim 14, which further comprises:

forming a third molding hole in the second area by patterning the mold layer and the anti-reflective layer; and forming a first portion of a conductive stud in the third molding hole by the removal of the portion of the storage node layer, wherein the first portion of the conductive stud is formed of the storage node layer.

16. The method of claim 15, which further comprises:

forming a capacitor dielectric layer on the storage nodes and the remaining portion of the mold layer;

forming a plate node layer on the capacitor dielectric layer; and forming a plate node on the plurality of storage nodes by patterning the plate node layer.

17. The method of claim 16, wherein the plate node layer is formed also in the second molding hole, thereby filling the second molding hole, which further comprises forming a third portion of the resistor in the second molding hole, wherein the third portion of the resistor is formed of the plate node layer.

* * * * *

UNITED STATES PATENT AND TRADEMARK OFFICE
CERTIFICATE OF CORRECTION

PATENT NO.   : 6,794,247 B2
DATED        : September 21, 2004
INVENTOR(S)  : Kwak et al.

It is certified that error appears in the above-identified patent and that said Letters Patent is hereby corrected as shown below:

Column 10,
Line 33, should read -- The method of claim 16, wherein the capacitor dielectric layer is formed also in the second molding hole, which further comprises forming a second portion of the resistor in the second molding hole, wherein the second portion of the resistor is formed of the capacitor dielectric layer. --.

Signed and Sealed this

Twenty-first Day of June, 2005

JON W. DUDAS
*Director of the United States Patent and Trademark Office*